(12) United States Patent
Kojima et al.

(10) Patent No.: US 8,012,850 B2
(45) Date of Patent: Sep. 6, 2011

(54) METHOD OF MANUFACTURING SEMICONDUCTOR DEVICE AND SEMICONDUCTOR DEVICE

(75) Inventors: Kazuaki Kojima, Nagano (JP); Takatoshi Igarashi, Nagano (JP); Kazuya Matsumoto, Nagano (JP)

(73) Assignee: Olympus Corporation, Tokyo (JP)

( * ) Notice: Subject to any disclaimer, the term of this patent is extended or adjusted under 35 U.S.C. 154(b) by 688 days.

(21) Appl. No.: 12/040,447

(22) Filed: Feb. 29, 2008

(65) Prior Publication Data

US 2008/0217743 A1     Sep. 11, 2008

(30) Foreign Application Priority Data

Mar. 6, 2007   (JP) .................................. 2007-056217

(51) Int. Cl.
*H01L 21/46*     (2006.01)
(52) U.S. Cl. ................. 438/458; 438/464; 257/E21.311; 257/E21.218
(58) Field of Classification Search .......... 438/455–465; 257/E21.311, E21.218
See application file for complete search history.

(56) References Cited

U.S. PATENT DOCUMENTS 6,663,227 B2 * 12/2003 Yamamoto et al. ............. 347/59

OTHER PUBLICATIONS

El Hassan, M. G. et al., "The Impact of Metal-1 Plasma Processing-Induced Hot Carrier Injection on the Characteristics and Reliability of n-MOSFET's", IEEE Transactions on Electron Devices, vol. 45, No. 4, Apr. 1998.

* cited by examiner

*Primary Examiner* — Matthew Reames
(74) *Attorney, Agent, or Firm* — Scully, Scott, Murphy & Presser, P.C.

(57) ABSTRACT

According to a method of manufacturing a semiconductor device, a short-circuit wiring is formed in a region on a wafer including a dicing region, and electrode pads for input and output signals of a plurality of devices disposed in a semiconductor device forming region are electrically short-circuited by the short-circuit wiring, so that occurrence of plasma damage is suppressed even if the wafer is subjected to various plasma processes. When the wafer subjected to the plasma processes is cut along the dicing region to separate a semiconductor device, the electrical short-circuit of the electrode pads by the short-circuit wiring is released, so that the functionally unwanted short-circuit of the devices or the like is appropriately released.

8 Claims, 6 Drawing Sheets

METHOD OF MANUFACTURING SEMICONDUCTOR DEVICE AND SEMICONDUCTOR DEVICE

CROSS REFERENCE TO RELATED APPLICATION

This application claims benefit of Japanese Patent No. 2007-56217 filed on Mar. 6, 2007 the contents of which are incorporated by this reference.

BACKGROUND OF THE INVENTION

1. Field of the Invention

The present invention relates to a method of manufacturing a semiconductor device using a plasma process and to a semiconductor device. In particular, it relates to a method of manufacturing a semiconductor device in which plasma damage after a step of forming a metal film, such as a wiring, is reduced and to a semiconductor device.

2. Description of the Related Art

In general, in manufacture of a semiconductor device on which various devices, such as a semiconductor element, a micromachine and a micro electro mechanical system (MEMS) are mounted, a plasma process, such as dry etching and ashing, is indispensable to meet requirements on the device, such as reduction of the two-dimensional size and formation of a three-dimensional structure.

When a plasma process is used in the process of manufacturing a semiconductor device, it is necessary to fully take into account the damage to an insulating film or the like caused by charges from the plasma accumulated on the substrate (referred to as plasma damage hereinafter).

In the device forming process, a plasma process may be used in a step of forming an interlayer insulating film before a metal wiring is formed or a step of removing a resist. However, the plasma damage in these steps is relatively small and can be eliminated by using a high-temperature annealing process. Thus, the plasma damage to the device is not significant.

On the other hand, for example, if reactive ion etching (RIE), which is a representative dry etching process that uses a plasma process, is used for forming a metal wiring, anisotropic processing according to the mask dimensions can be very advantageously achieved. However, because the metal film (the metal wiring, the electrode pad or the like) is exposed to the plasma during etching, charges in the plasma can be accumulated in the metal film to make the metal film electrically charged, and, as a result, a potential difference can occur between the metal film and the insulating film, causing degradation of the device characteristics or, in the worst case, an electric breakdown. Such plasma damage is a large problem concerning various devices, such as a semiconductor element and a micromachine. In addition, the metal film generally has a low melting point, so that the high-temperature annealing process cannot be used for the substrate after the metal film is formed, and therefore, it may be difficult to recover from the plasma damage to the insulating film or the like.

To solve the problem, for example, a non-patent literature (IEEE Transactions on Electron Devices, vol. 45, No. 4, 1998) discloses a technique of protecting a MOSFET, which is a representative semiconductor element, from plasma damage, according to which a source 1, a drain 2 and a gate 3 of the MOSFET and all pad electrodes 4 electrically connected to a substrate are connected to each other by a fuse wiring 5 (see FIG. 7). According to this technique, charges accumulated in the gate electrode during the plasma process are dissipated through the fuse wiring into the substrate from a substrate electrode electrically connected to a diffusion layer having the same conductive type as the semiconductor substrate or from a source electrode or a drain electrode electrically connected to the diffusion layer having the conductive type opposite to that of the semiconductor substrate, thereby reducing the plasma damage.

SUMMARY OF THE INVENTION

A method of manufacturing a semiconductor device according to the present invention comprises: a short-circuit wiring forming step of forming a short-circuit wiring in a region on a wafer including a dicing region that defines a semiconductor device forming region and electrically short-circuiting electrode pads for input and output signals of a plurality of devices disposed in the semiconductor device forming region by the short-circuit wiring; a plasma step of performing a plasma process on the wafer; and a dicing step of cutting the wafer along the dicing region to separate a semiconductor device and release the electrical short-circuit of the electrode pads.

A semiconductor device according to the present invention is manufactured using the method of manufacturing a semiconductor device described above.

The above and other objects, features and advantages of the invention will become more clearly understood from the following description referring to the accompanying drawings.

DETAILED DESCRIPTION OF THE PREFERRED EMBODIMENTS

Figure 1:
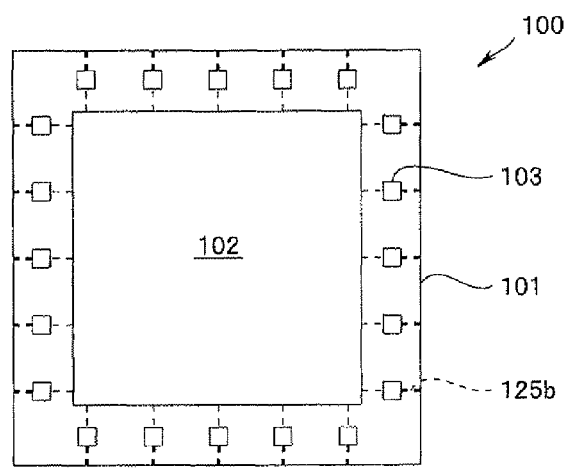
FIG. 1 is a schematic plan view showing a configuration of a semiconductor device according to a first embodiment of the present invention.
Figure 2:
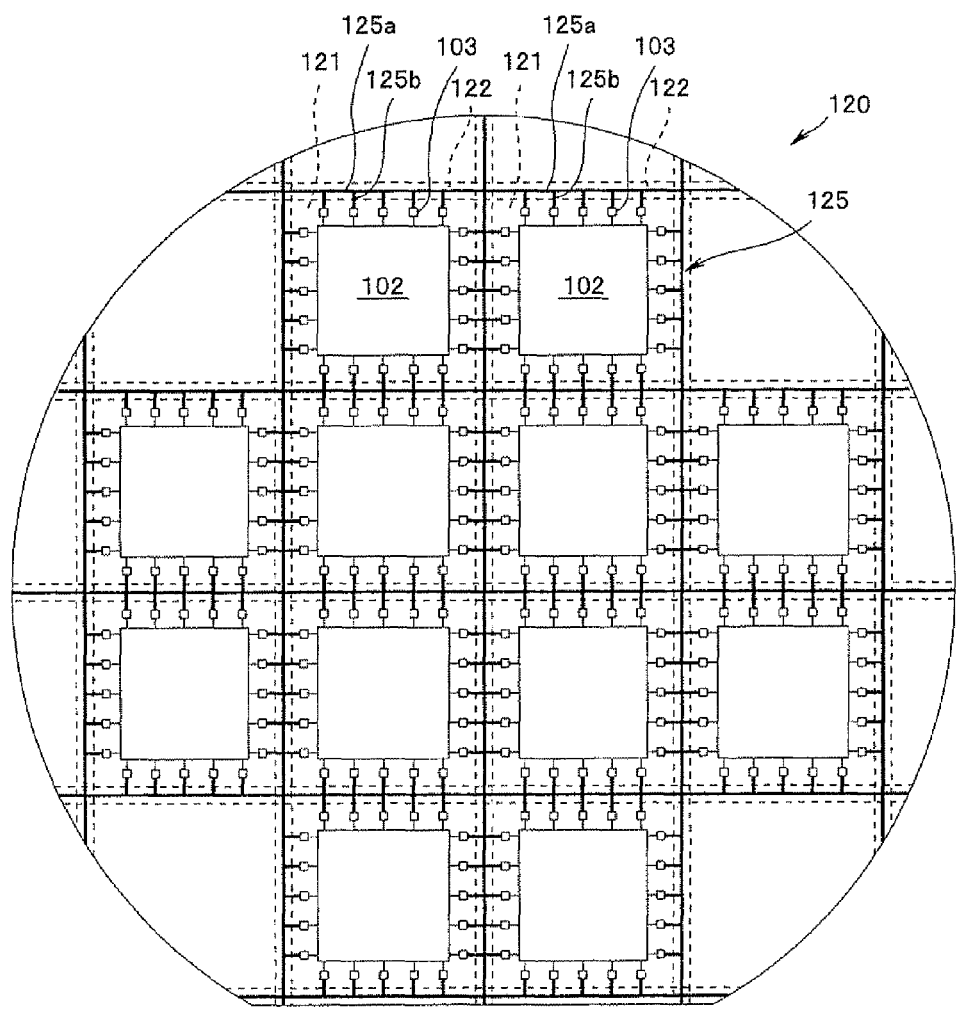
FIG. 2 is a plan view showing a semiconductor wafer yet to be diced.
Figure 3:
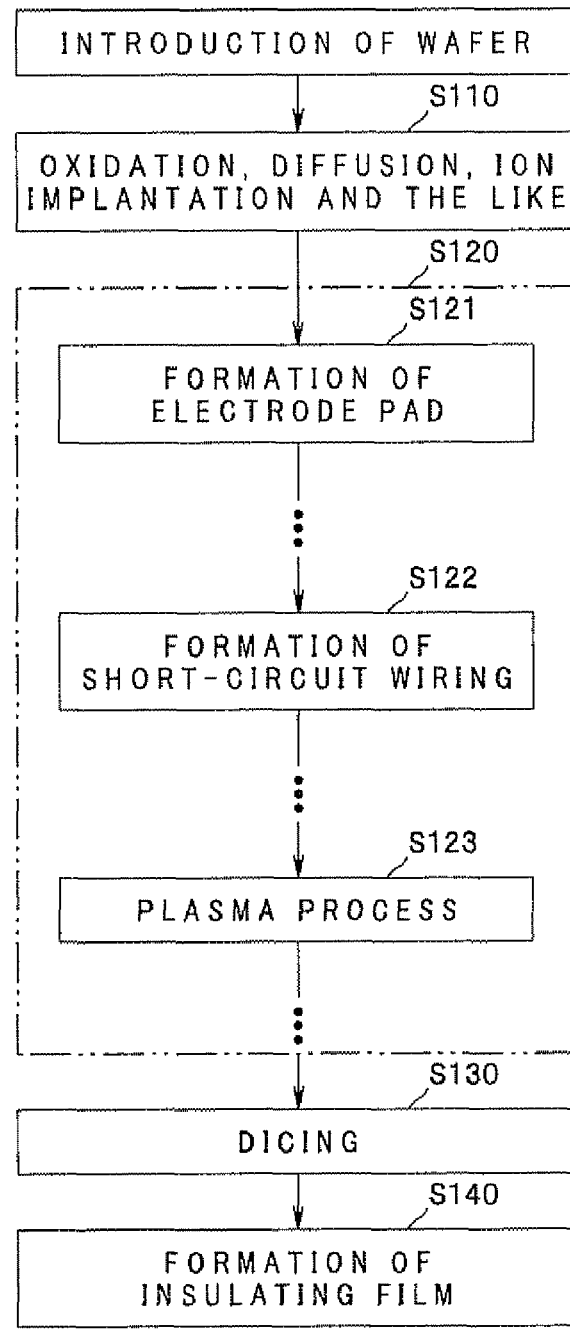
FIG. 3 is a flowchart for illustrating a process of manufacturing the semiconductor device.

In the following, embodiments of the present invention will be described with reference to the drawings. FIGS. 1 to 3 relate to a first embodiment of the present invention. FIG. 1 is a schematic plan view showing a configuration of a semiconductor device, FIG. 2 is a plan view showing a semiconductor wafer yet to be diced, and FIG. 3 is a flowchart for illustrating a process of manufacturing the semiconductor device.

As shown in FIG. 1, a semiconductor device 100 according to the present embodiment has a semiconductor substrate 101 having a substantially rectangular shape in plan view. On a front surface of the semiconductor substrate 101, a group of devices 102 including a plurality of various devices (not shown), such as a semiconductor element and a micromachine, is disposed. On the front surface of the semiconductor substrate 101, a plurality of electrode pads 103 for signal input/output, which are electrically connected to the various devices, are arranged along a perimeter of the semiconductor substrate 101. At least one of the electrode pads 103 penetrates through an interlayer insulating film or the like formed below the electrode pad 103 and is electrically connected to the semiconductor substrate 101.

In the present embodiment, the semiconductor device 100 is manufactured by simultaneously forming a plurality of semiconductor devices on a semiconductor wafer (referred to simply as wafer hereinafter) 120 and then separating the semiconductor devices from each other by dicing as shown in FIG. 2, for example. Specifically, the wafer 120 contains a plurality of semiconductor device forming regions 121, which are defined by a dicing region 122. After the electrode pads 103 and the various devices are formed in each semiconductor device forming region 121 on the wafer 120, the wafer 120 is cut along the dicing region 122 to separate the semiconductor device forming regions 121 from each other. In this way, the semiconductor device 100 is provided.

Now, a process of manufacturing the semiconductor device 100 described above will be described with reference to FIG. 3.

A wafer 120 is introduced, and the process of manufacturing a semiconductor device 100 is started. First, in step SI 10, devices are formed by oxidation, diffusion, ion implantation and the like. Then, in step S120, which is a wiring process, a plurality of electrode pads 103 are formed in each semiconductor device forming region 121 on the wafer 120. As described above, at least one of the electrode pads 103 is electrically connected to the wafer 120 (semiconductor substrate 101) via a contact hole or the like that penetrates through an interlayer insulating film or the like formed below the electrode pad 103.

In the following step S120, a multilayer metal wiring is formed with an interlayer insulating film interposed between the multiple layers. In the present embodiment, at the start of the metal wiring formation, a common short-circuit wiring 125 that electrically connects all the electrode pads 103 is formed (short-circuit wiring forming process) (sub-step S122).

As shown in FIG. 2, the short-circuit wiring 125 is formed in a region on the wafer 120 including the dicing region 122. In the present embodiment, for example, the short-circuit wiring 125 has a main wiring 125a that runs through the dicing region 122 and junction lines 125b that connect the main wiring 125a to the respective electrode pads 103. The short-circuit wiring 125 makes the potential at each electrode pad 103 equal to the potential at the substrate (wafer 120) by short-circuiting all the electrode pads 103 including the electrode pad 103 electrically connected to the wafer 120.

More specifically, since the short-circuit wiring 125 is formed at the start of the wiring process, the short-circuit wiring 125 is preferably formed simultaneously with an undermost metal wiring (internal wiring) of various devices including semiconductor elements. In this case, for example, a metal film is deposited on a region including the dicing region 122, and the metal film is patterned to form the metal wiring of the devices and the short-circuit wiring 125. Even if a plasma process, such as sputtering and RIE process, is used in this process, charges (accumulated charges) produced by the plasma process dissipate into the wafer 120 through the short-circuit wiring 125 (or the metal film yet to become the short-circuit wiring 125 by patterning or the like), so that plasma damage is reduced.

After the short-circuit wiring 125 is formed, a multilayer metal wiring is formed by various processes including various plasma processes (sub-step 123), such as sputtering and RIE process, thereby completing the various devices in the semiconductor device forming region 121. That is, as required, the plasma processes are used to form a contact hole, various metal wiring layers, a surface protective film or the like. The stack of metal wirings or the like of the various devices formed by the plasma process or the like is typically electrically connected to the electrode pads 103 in some way, so that the potential at the metal wirings is equal to the potential at the wafer 120, and plasma damage is appropriately suppressed.

Once the various devices or the like are formed on the wafer 120, the process proceeds to step S130. In step S130, a dicing process is carried out in which the wafer 120 is cut along the dicing region 122 on the wafer 120 into separate semiconductor device forming regions 121 (or in other words, separate semiconductor devices 100). Since the main wiring 125a of the short-circuit wiring 125 runs through the dicing region 122 and is connected to each junction line 125b to short-circuit each electrode pad 103 as described above, when the dicing region 122 is cut away in the dicing process, each electrode pad 103 is electrically released.

In the dicing process, the whole of the wafer 120 can be diced into separate semiconductor devices 100 at one time, or a part of the short-circuit wiring 125 and wafer 120 can be cut along the dicing region 122, and the operating characteristics or the like of each device or the like on the wafer 120 can be inspected before the remainder of the wafer 120 is diced into separate semiconductor devices 100. Alternatively, the wafer 120 can be diced into separate semiconductor devices 100 after the short-circuit wiring 125 is cut by wet etching or the like, which does not damage the devices.

Then, in step S140, an insulating film is formed to protect the ends of the short-circuit wiring 125 (the junction lines 125b) that are exposed on the edge face of the substrate of each semiconductor device 100 as a result of the dicing.

According to the present embodiment, since the short-circuit wiring 125 is formed on a region on the wafer 120 including the dicing region 122, and the electrode pads 103 for signal input/output of a plurality of devices disposed in the semiconductor device forming region 121 are electrically short-circuited by the short-circuit wiring 125, plasma damage can be suppressed even if the wafer 120 is subjected to various plasma processes. In addition, since the electrode pads 103 short-circuited by the short-circuit wiring 125 are electrically released when the wafer 120 subjected to the plasma processes is cut along the dicing region 122 into separate semiconductor devices 100, functionally unwanted short circuits of the devices or the like can be appropriately eliminated.

Therefore, plasma damage, in particular, plasma damage in steps after formation of the metal film can be reduced and preferable device characteristics can be achieved with a simple configuration and a simple process. Therefore, the yield of manufacture of the semiconductor device 100 is improved, and the reliability of the semiconductor device 100 is improved.

In this case, the short-circuit wiring 125 can be formed without any unwanted additional process or the like, because the short-circuit wiring 125 is formed simultaneously with the metal wiring for connecting the device elements in the wiring process. In particular, if the short-circuit wiring 125 is formed simultaneously with the undermost metal wiring, plasma damage can be reduced in all the succeeding plasma processes including the plasma process for forming the upper metal wirings. Furthermore, the lower the layer on which the short-circuit wiring 125 is formed, the more easily the wiring is formed with high conformity to differences in height on the layer, because the surface of the layer is more even. Therefore, the reliability is improved.

The electrode pads 103 and the short-circuit wiring 125 can be formed in any process of forming a conductive film, such as a metal film, preceding the plasma processes, which can cause plasma damage. For example, the short-circuit wiring 125 can be formed in the process of forming the electrode pads 103. Alternatively, the short-circuit wiring 125 can be formed in a separate process.

Figure 4B:
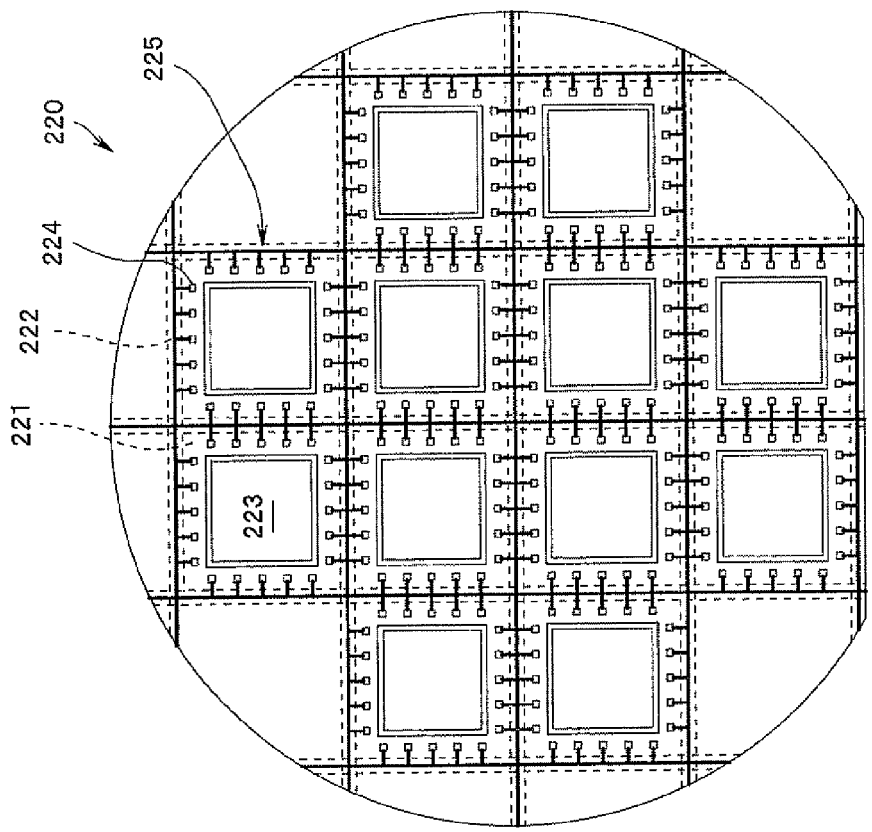
FIG. 4B is a plan view showing the supporting substrate yet to be bonded to the semiconductor wafer.
Figure 4A:
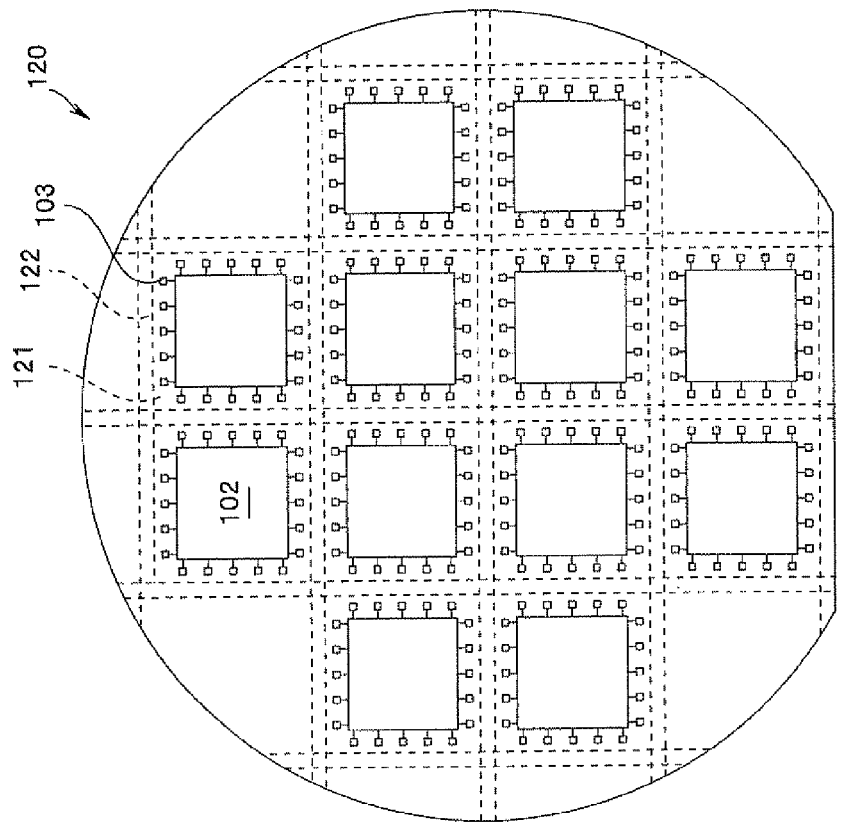
FIG. 4A is a plan view showing a semiconductor wafer yet to be bonded to a supporting substrate according to an second embodiment of the present invention.
Figure 5:
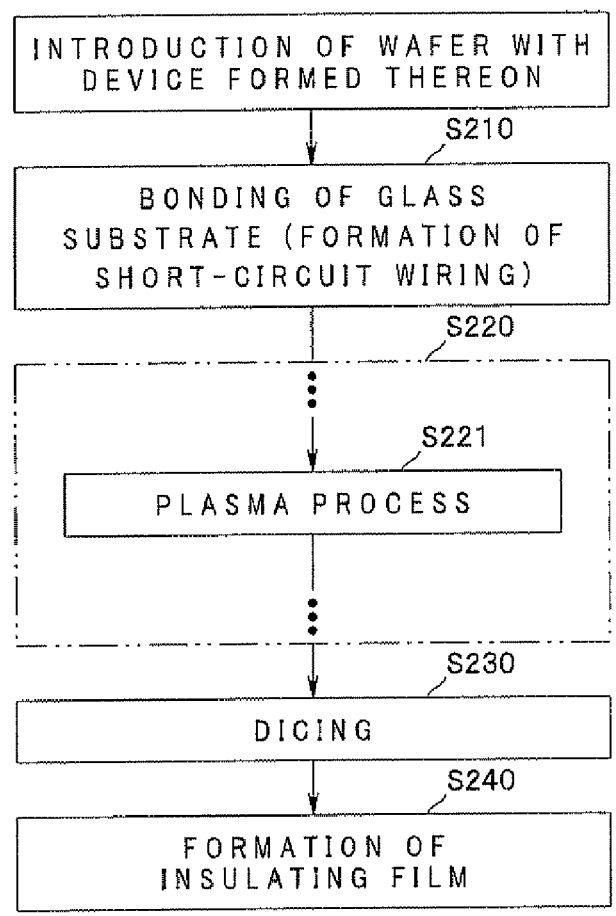
FIG. 5 is a flowchart for illustrating a process of manufacturing a semiconductor device.

FIGS. 4A to 6 relate to a second embodiment of the present invention. FIG. 4A is a plan view showing a semiconductor wafer yet to be bonded to a supporting substrate. FIG. 4B is a plan view showing the supporting substrate yet to be bonded to the semiconductor wafer. FIG. 5 is a flowchart for illustrating a process of manufacturing a semiconductor device. FIG. 6A is a cross-sectional view showing essential parts of the semiconductor wafer bonded to the supporting substrate. FIG. 6B is a cross-sectional view showing essential parts of the semiconductor wafer having a penetration wiring formed therein. FIG. 6C is a cross-sectional view showing essential parts of a separated semiconductor device. In the present embodiment, there will be described a case where a wafer 120 with electrode pads 103 and various devices or the like formed thereon is subjected to an additional processing using a plasma process. In the present embodiment, as a specific example, there will be described a method of manufacturing a semiconductor device 100 of CSP type (a solid state imaging device) in which a device group 102 includes a plurality of image sensors, a supporting base 200 (substrate) of transparent glass or the like is bonded to a front surface of a semiconductor substrate 101 (on the side of an imaging surface), and each electrode pad 103 is electrically connected to an external connection terminal on a back side of the semiconductor substrate 101 via a penetration wiring 217 penetrating through the semiconductor substrate 101. The same parts as those in the first embodiment described above are denoted by the same reference numerals, and further descriptions thereof will be omitted.

As shown in FIG. 5, in the present embodiment, once a wafer 120 with a device group 102 and electrode pads 103, corresponding to each semiconductor device 100, formed on a front surface thereof is introduced, first, in step S210, for example, a glass substrate 220 is bonded to the front surface of the wafer 120.

As shown in FIGS. 4A and 4B, the glass substrate 220 has the same shape in plan view as the wafer 120, for example. The glass substrate 220 has supporting substrate forming regions 221 corresponding to semiconductor device forming regions 121 on the wafer 120 defined by a dicing region 222. In each supporting substrate forming region 221, a recess 223 corresponding to the device group 102, which constitutes a light-receiving region of the image sensor, is formed and provides a cavity between the glass substrate 220 and the wafer 120 (semiconductor substrate 101). Electrode pad contacts 224 corresponding to the electrode pads 103 on the wafer 120 are formed around the recess 223, and a short-circuit wiring 225 is formed in a region on the glass substrate 220 including the dicing region 222 to electrically short-circuit the electrode pad contacts 224. In the present embodiment, the short-circuit wiring 225 has a main wiring 225a running through the dicing region 222 and junction lines 225b connecting the main wiring 225a to the respective electrode pad contacts 224. The electrode pad contacts 224, the short-circuit wiring 225 and the recess 223 can be formed on the glass substrate 220 in any manner.

Once such a glass substrate 220 is bonded to the wafer 120, and the electrode pad contacts 224 are electrically connected to the electrode pads 103, the electrode pads 103 are electrically short-circuited. In other words, in the present embodiment, by bonding the glass substrate 220 to the wafer 120, the short-circuit wiring 225 is formed in the region on the wafer 120 including the dicing region 122, and the electrode pads 103 are short-circuited. For an adhesive layer 213 for bonding the wafer 120 and the glass substrate 220 to each other (see FIG. 6A), a thermosetting resin, such as benzocyclobutene (BCB) resin, is preferably used.

Figure 6A:
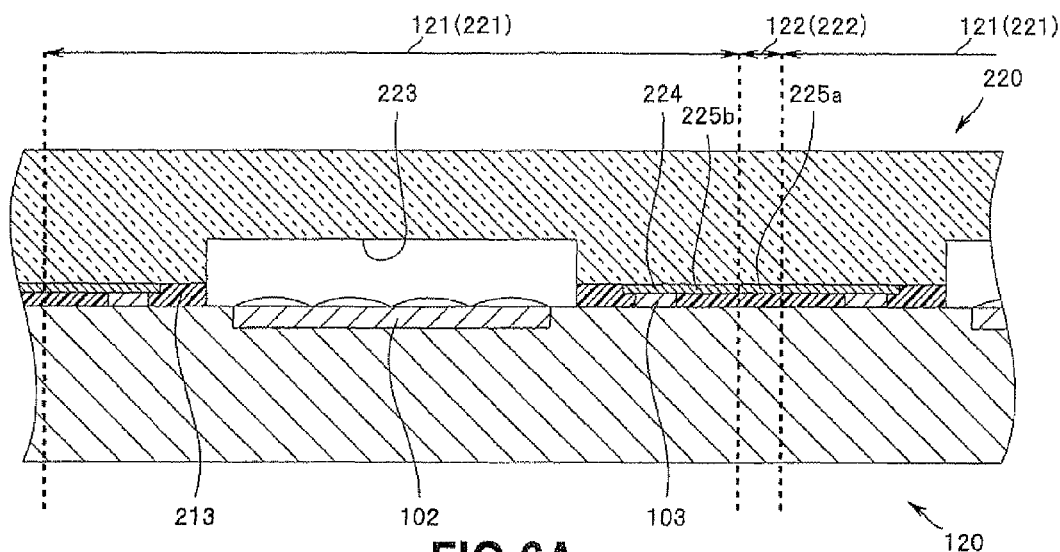
FIG. 6A is a cross-sectional view showing essential parts of the semiconductor wafer bonded to the supporting substrate.
Figure 6B:
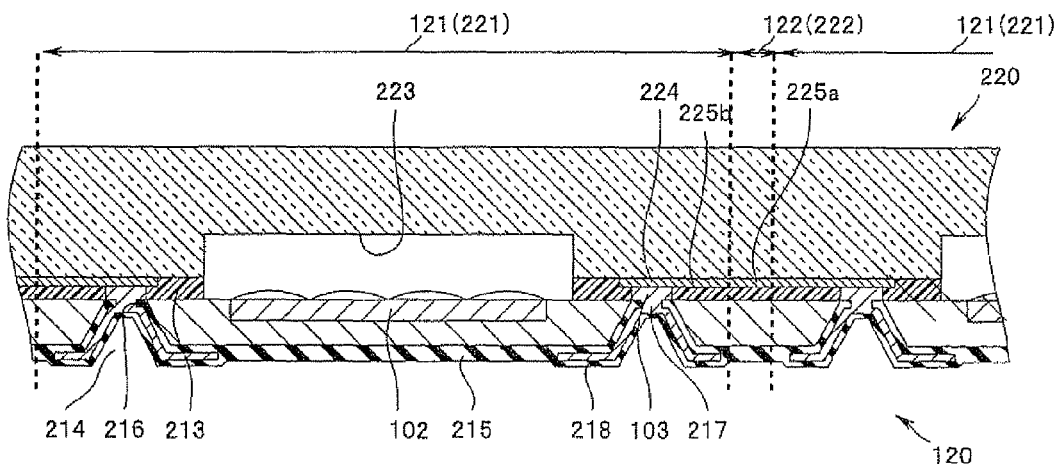
FIG. 6B is a cross-sectional view showing essential parts of the semiconductor wafer in which a penetration wiring is formed.
Figure 6C:
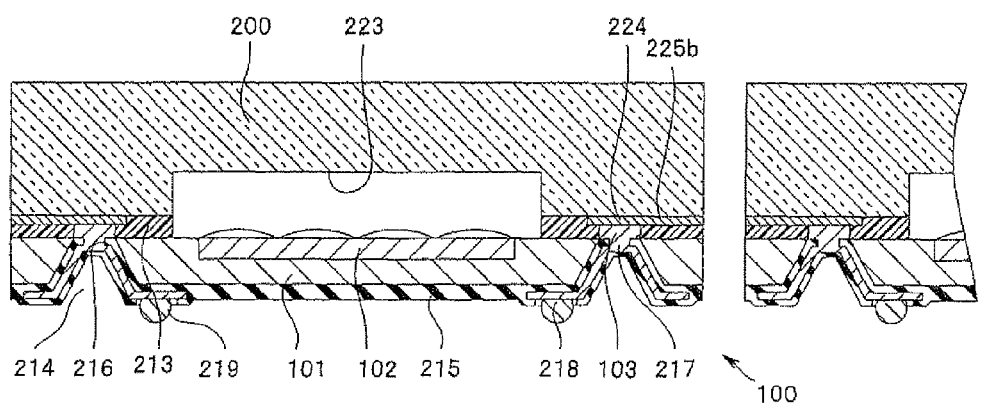
FIG. 6C is a cross-sectional view showing essential parts of a separated semiconductor device.
Figure 7:
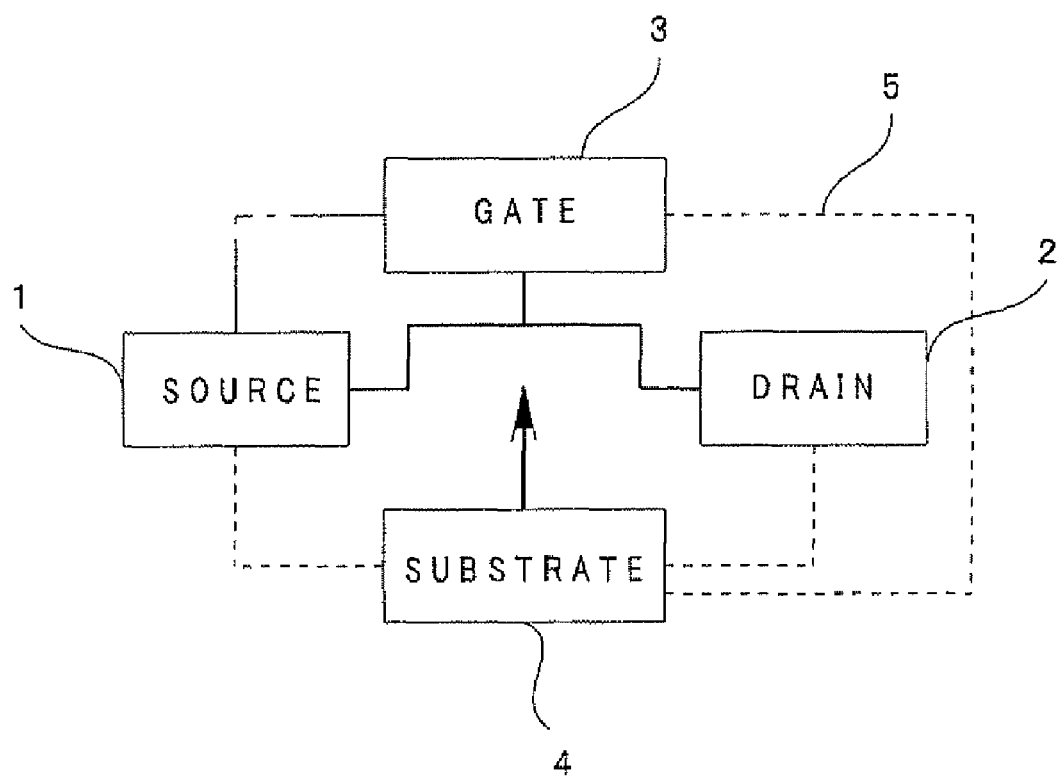
FIG. 7 is a schematic diagram showing a MOSFET according to a conventional technique.

Then, in step S220, the back surface of the wafer 120 is subjected to an additional post-processing. Specifically, for example, after the back surface of the wafer 120 is polished until the thickness of the wafer 120 becomes about several tens to several hundreds micrometer, various processings, such as those shown in FIG. 6B, are performed. Specifically, through holes 214 are formed in the wafer 120 at positions corresponding to the electrode pads 103 from the back surface thereof, and an insulating film 215 is formed on the inner wall of each through hole 214 and the entire back surface of the wafer 120. Furthermore, penetration wirings 217 passing through contact holes 216 and electrically connected to the electrode pads 103 are formed on the insulating film 215 on the inner walls of the through holes 214 and back surface of the wafer 120, and a back surface protective film 218 is formed on the penetration wirings 217.

For example, plasma-enhanced chemical vapor deposition (CVD) is used to form the insulating film 215, RIE is used to form the contact holes 216 in the insulating film 215, sputtering and RIE are used to form the penetration wirings 217, and plasma-enhanced CVD is used to form the back surface protective film 218. That is, various plasma processes (S221) are used in the present post-processing. Even if the electrode pads 103, the penetration wirings 217 or the like are exposed to plasma during such plasma processes, charges in the plasma are dissipated into the wafer 120 (semiconductor substrate 101) through the short-circuit wiring 225 rather than accumulated in the electrode pads 103 or the penetration wirings 217, and therefore, plasma damage can be reduced.

Then, in step S230, a dicing process is carried out in which the wafer 120 and glass substrate 220 are cut into separate semiconductor device forming regions 121 (semiconductor devices 100) along the dicing regions 122 and 222. Since the main wiring 225a of the short-circuit wiring 225 runs through the dicing regions 122 and 222 and is connected to each junction line 225b to short-circuit each electrode pad 103 as described above, when the dicing regions 122 and 222 are cut away in the dicing process, each electrode pad 103 is electrically released (see FIG. 6C). As required, an external connection terminal for external electrical connection, such as a bump 219 made of a conductive material, can be formed on the penetration wirings 217 on the back surface of the semiconductor substrate 101.

Then, in step S240, an insulating film is formed to protect the ends of the short-circuit wiring 225 (the junction lines 225b) that are exposed on the edge face of the substrate of each semiconductor device 100 as a result of the dicing.

According to the present embodiment, in addition to the same advantages as those in the first embodiment described above, reduction of plasma damage is achieved by forming the short-circuit wiring 225 on the glass substrate 220 rather than on the wafer 120 with various devices formed thereon and then bonding the wafer 120 and the glass substrate 220 to each other. Therefore, for example, plasma damage to an externally purchased wafer 120 with various devices formed thereon in an additional processing thereof can also be reduced.

In the present embodiment, the short-circuit wiring 225 is formed on the glass substrate 220. However, of course, as in the first embodiment, the short-circuit wiring can be formed on the wafer 120.

In the present embodiment, the semiconductor device 100 in which the device group 102 includes image sensors having a micro lens has been described as an example. However, the present invention is not limited thereto, and the present embodiment of the present invention can be applied to any kinds of semiconductor devices.

Furthermore, there has been described the solid state imaging device in which the transparent-glass supporting substrate is bonded to the semiconductor substrate with image sensors formed thereon. However, of course, in a case of a device that requires no transparent glass substrate or the like for the image sensor, the supporting substrate can be used simply as a reinforcing substrate in the additional processing of the semiconductor substrate and can be removed after the device is completed.

In each embodiment described above, electrode pads connected to a protection diode or the like, and plasma damage to which during manufacture can be reduced, may not be interconnected by the short-circuit wiring.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A method of manufacturing a semiconductor device, comprising:
    an electrical short-circuiting step of bonding a substrate on which a short-circuit wiring is formed to a semiconductor wafer which includes a semiconductor device forming region having a plurality of first electrode pads, and a first dicing region that defines the semiconductor device forming region, thereby electrically short-circuiting the plurality of first electrode pads through the short-circuit wiring; and
    a dicing step of cutting the wafer along the first dicing region to separate a semiconductor device and release the electrical short-circuit of the plurality of first electrode pads.

2. The method of manufacturing a semiconductor device according to claim 1, wherein the substrate is a glass substrate having the same shape in plan view as the semiconductor wafer and includes a further comprises a supporting substrate forming region corresponding to the semiconductor device forming region, the supporting substrate forming region being designed by a second dicing region, and the short-circuit wiring is formed in the second dicing region.

3. The method of manufacturing a semiconductor device according to claim 2, wherein second electrode pads corresponding to the first electrode pads are formed in the supporting substrate forming region formed on the substrate, the substrate being a glass substrate, and the short-circuit wiring is electrically connected to the first electrode pads through the second electrode pads.

4. The method of manufacturing a semiconductor device according to claim 1, further comprising:
    an insulating step of coating the short-circuit wiring exposed on an edge face of the semiconductor device separated in the dicing step with an insulating film.

5. The method of manufacturing a semiconductor device according to claim 1, further comprising:
    an additional process step performed on the semiconductor wafer to which the substrate is bonded, the substrate being a glass substrate, prior to the dicing step.

6. The method of manufacturing a semiconductor device according to claim 2, further comprising:
    an additional process step performed on the semiconductor wafer to which the glass substrate is bonded, prior to the dicing step.

7. The method of manufacturing a semiconductor device according to claim 3, further comprising:
    an additional process step performed on the semiconductor wafer to which the glass substrate is bonded, prior to the dicing step.

8. The method of manufacturing a semiconductor device according to claim 4, further comprising:
    an additional process step performed on the semiconductor wafer to which the glass substrate is bonded, prior to the dicing step.

* * * * *